(12) United States Patent
Gharibdoust et al.

(10) Patent No.: US 11,038,518 B2
(45) Date of Patent: Jun. 15, 2021

(54) DYNAMIC INTEGRATION TIME ADJUSTMENT OF A CLOCKED DATA SAMPLER USING A STATIC ANALOG CALIBRATION CIRCUIT

(71) Applicant: Kandou Labs SA, Lausanne (CH)

(72) Inventors: Kiarash Gharibdoust, Lonay (CH); Armin Tajalli, Salt Lake City, UT (US); Pavan Kumar Jampani, Northampton (GB); Ali Hormati, Ecublens Vaud (CH)

(73) Assignee: KANDOU LABS, S.A., Lausanne (CH)

( * ) Notice: Subject to any disclaimer, the term of this patent is extended or adjusted under 35 U.S.C. 154(b) by 0 days.

(21) Appl. No.: 16/897,033

(22) Filed: Jun. 9, 2020

(65) Prior Publication Data

US 2020/0321972 A1 Oct. 8, 2020

Related U.S. Application Data

(63) Continuation of application No. 16/378,467, filed on Apr. 8, 2019, now Pat. No. 10,680,634.

(51) Int. Cl.
*H03M 1/12* (2006.01)
*H03M 1/36* (2006.01)
(Continued)

(52) U.S. Cl.
CPC ......... *H03M 1/1245* (2013.01); *H03M 1/069* (2013.01); *H03M 1/1004* (2013.01); *H03M 1/1215* (2013.01); *H03M 1/365* (2013.01)

(58) Field of Classification Search
CPC .. H03M 1/1245; H03M 1/069; H03M 1/1215; H03M 1/1004; H03M 1/365; H03M 1/1009; H03K 19/00369
(Continued)

(56) References Cited

U.S. PATENT DOCUMENTS 3,636,463 A 1/1972 Ongkiehong
3,824,494 A 7/1974 Wilcox
(Continued)

FOREIGN PATENT DOCUMENTS

EP   0425064 A2   5/1991
WO  2018052657 A1  3/2018
WO  2019241081 A1  12/2019

OTHER PUBLICATIONS

International Search Report and Written Opinion for PCT/US2020/026693, dated Jul. 30, 2020, 1-11 (11 pages).
(Continued)

*Primary Examiner* — Khai M Nguyen
(74) *Attorney, Agent, or Firm* — Invention Mine LLC

(57) ABSTRACT

Methods and systems are described for generating a process-voltage-temperature (PVT)-dependent reference voltage at a reference branch circuit based on a reference current obtained via a band gap generator and a common mode voltage input, generating a PVT-dependent output voltage at an output of a static analog calibration circuit responsive to the common mode voltage input and an adjustable current, adjusting the adjustable current through the static analog calibration circuit according to a control signal generated responsive to comparisons of the PVT-dependent output voltage to the PVT-dependent reference voltage, and configuring a clocked data sampler with a PVT-calibrated current by providing the control signal to the clocked data sampler.

20 Claims, 4 Drawing Sheets

(51) Int. Cl.
  *H03M 1/10* (2006.01)
  *H03M 1/06* (2006.01)
(58) Field of Classification Search
  USPC .................................. 341/120, 164
  See application file for complete search history.

(56) References Cited

U.S. PATENT DOCUMENTS

| | | | |
|---|---|---|---|
| 3,939,468 A | 2/1976 | Mastin | |
| 4,276,543 A | 6/1981 | Miller et al. | |
| 4,774,498 A | 9/1988 | Traa | |
| 4,897,657 A | 1/1990 | Brubaker | |
| 5,017,924 A | 5/1991 | Guiberteau et al. | |
| 5,459,465 A | 10/1995 | Kagey | |
| 5,510,736 A | 4/1996 | Van de Plassche | |
| 5,748,948 A | 5/1998 | Yu et al. | |
| 5,793,254 A | 8/1998 | Oconnor | |
| 5,945,935 A | 8/1999 | Kusumoto et al. | |
| 6,094,075 A * | 7/2000 | Garrett, Jr. | G06F 13/4077 |
| | | | 327/108 |
| 6,226,330 B1 | 5/2001 | Mansur | |
| 6,232,908 B1 | 5/2001 | Nakaigawa | |
| 6,346,907 B1 | 2/2002 | Dacy et al. | |
| 6,384,758 B1 | 5/2002 | Michalski et al. | |
| 6,396,329 B1 | 5/2002 | Zerbe | |
| 6,400,302 B1 | 6/2002 | Amazeen et al. | |
| 6,462,584 B1 | 10/2002 | Proebsting | |
| 6,563,382 B1 | 5/2003 | Yang | |
| 6,624,699 B2 | 9/2003 | Yin et al. | |
| 6,839,587 B2 | 1/2005 | Yonce | |
| 6,879,816 B2 | 4/2005 | Bult et al. | |
| 6,888,483 B2 | 5/2005 | Mulder | |
| 6,972,701 B2 | 12/2005 | Jansson | |
| 7,075,996 B2 | 7/2006 | Simon et al. | |
| 7,167,523 B2 | 1/2007 | Mansur | |
| 7,188,199 B2 | 3/2007 | Leung et al. | |
| 7,199,728 B2 | 4/2007 | Dally et al. | |
| 7,269,212 B1 | 9/2007 | Chau et al. | |
| 7,285,977 B2 | 10/2007 | Kim | |
| 7,372,295 B1 * | 5/2008 | Wei | H04L 25/0278 |
| | | | 326/27 |
| 7,372,390 B2 | 5/2008 | Yamada | |
| 7,397,302 B2 | 7/2008 | Bardsley et al. | |
| 7,528,758 B2 | 5/2009 | Ishii | |
| 7,560,957 B2 | 7/2009 | Chen et al. | |
| 7,635,990 B1 | 12/2009 | Ren et al. | |
| 7,656,321 B2 | 2/2010 | Wang | |
| 7,683,720 B1 | 3/2010 | Yehui et al. | |
| 7,688,102 B2 | 3/2010 | Bae et al. | |
| 7,697,915 B2 | 4/2010 | Behzad et al. | |
| 7,804,361 B2 | 9/2010 | Lim et al. | |
| 7,957,472 B2 | 6/2011 | Wu et al. | |
| 8,000,664 B2 | 8/2011 | Khorram | |
| 8,030,999 B2 | 10/2011 | Chatterjee et al. | |
| 8,106,806 B2 | 1/2012 | Toyomura et al. | |
| 8,159,375 B2 | 4/2012 | Abbasfar | |
| 8,159,376 B2 | 4/2012 | Abbasfar | |
| 8,183,930 B2 | 5/2012 | Kawakami et al. | |
| 8,547,272 B2 | 10/2013 | Nestler et al. | |
| 8,581,824 B2 | 11/2013 | Baek et al. | |
| 8,604,879 B2 | 12/2013 | Mourant et al. | |
| 8,643,437 B2 | 2/2014 | Chiu et al. | |
| 8,674,861 B2 | 3/2014 | Matsuno et al. | |
| 8,687,968 B2 | 4/2014 | Nosaka et al. | |
| 8,704,583 B2 | 4/2014 | Bulzacchelli et al. | |
| 8,791,735 B1 | 7/2014 | Shibasaki | |
| 8,841,936 B2 | 9/2014 | Nakamura | |
| 8,860,590 B2 | 10/2014 | Yamagata et al. | |
| 9,069,995 B1 | 6/2015 | Cronie | |
| 9,106,465 B2 | 8/2015 | Walter | |
| 9,148,087 B1 | 9/2015 | Tajalli | |
| 9,178,503 B2 | 11/2015 | Hsieh | |
| 9,281,785 B2 | 3/2016 | Sjöland | |
| 9,292,716 B2 | 3/2016 | Winoto et al. | |
| 9,300,503 B1 | 3/2016 | Holden et al. | |
| 9,755,599 B2 | 9/2017 | Yuan et al. | |
| 10,003,315 B2 | 6/2018 | Tajalli | |
| 10,200,218 B2 | 2/2019 | Tajalli | |
| 10,326,623 B1 | 6/2019 | Tajalli | |
| 2001/0006538 A1 | 7/2001 | Simon et al. | |
| 2002/0050861 A1 | 5/2002 | Nguyen et al. | |
| 2002/0149508 A1 | 10/2002 | Hamashita | |
| 2002/0158789 A1 | 10/2002 | Yoshioka et al. | |
| 2002/0174373 A1 | 11/2002 | Chang | |
| 2003/0016763 A1 | 1/2003 | Doi et al. | |
| 2003/0085763 A1 | 5/2003 | Schrodinger et al. | |
| 2003/0132791 A1 | 7/2003 | Hsieh | |
| 2003/0160749 A1 | 8/2003 | Tsuchi | |
| 2003/0174023 A1 | 9/2003 | Miyasita | |
| 2003/0184459 A1 | 10/2003 | Engl | |
| 2003/0218558 A1 | 11/2003 | Mulder | |
| 2004/0027185 A1 | 2/2004 | Fiedler | |
| 2004/0169529 A1 | 9/2004 | Afghani et al. | |
| 2005/0008099 A1 | 1/2005 | Brown | |
| 2005/0057379 A1 | 3/2005 | Jansson | |
| 2005/0218980 A1 | 10/2005 | Kalb | |
| 2005/0270098 A1 | 12/2005 | Zhang et al. | |
| 2006/0036668 A1 | 2/2006 | Jaussi et al. | |
| 2006/0097786 A1 | 5/2006 | Su et al. | |
| 2006/0103463 A1 | 5/2006 | Lee et al. | |
| 2006/0192598 A1 | 8/2006 | Baird et al. | |
| 2006/0194598 A1 | 8/2006 | Kim et al. | |
| 2007/0009018 A1 | 1/2007 | Wang | |
| 2007/0097579 A1 | 5/2007 | Amamiya | |
| 2007/0104299 A1 | 5/2007 | Cahn et al. | |
| 2007/0159247 A1 | 7/2007 | Lee et al. | |
| 2007/0176708 A1 | 8/2007 | Otsuka et al. | |
| 2007/0182487 A1 | 8/2007 | Ozasa et al. | |
| 2007/0188367 A1 | 8/2007 | Yamada | |
| 2007/0201546 A1 | 8/2007 | Lee | |
| 2007/0285156 A1 | 12/2007 | Roberts et al. | |
| 2008/0001626 A1 | 1/2008 | Bae et al. | |
| 2008/0107209 A1 | 5/2008 | Cheng et al. | |
| 2008/0165841 A1 | 7/2008 | Wall et al. | |
| 2008/0187037 A1 | 8/2008 | Bulzacchelli et al. | |
| 2009/0090333 A1 | 4/2009 | Spadafora et al. | |
| 2009/0115523 A1 | 5/2009 | Akizuki et al. | |
| 2009/0146719 A1 | 6/2009 | Pernia et al. | |
| 2009/0323864 A1 | 12/2009 | Tired | |
| 2010/0148819 A1 | 6/2010 | Bae et al. | |
| 2010/0156691 A1 | 6/2010 | Taft | |
| 2010/0219781 A1 | 9/2010 | Kuwamura | |
| 2010/0235673 A1 | 9/2010 | Abbasfar | |
| 2010/0271107 A1 | 10/2010 | Tran et al. | |
| 2011/0028089 A1 | 2/2011 | Komori | |
| 2011/0032977 A1 | 2/2011 | Hsiao et al. | |
| 2011/0051854 A1 | 3/2011 | Kizer et al. | |
| 2011/0057727 A1 | 3/2011 | Cranford et al. | |
| 2011/0096054 A1 | 4/2011 | Cho et al. | |
| 2011/0103508 A1 | 5/2011 | Mu et al. | |
| 2011/0133816 A1 | 6/2011 | Wu et al. | |
| 2011/0156819 A1 | 6/2011 | Kim et al. | |
| 2012/0025911 A1 | 2/2012 | Zhao et al. | |
| 2012/0044021 A1 | 2/2012 | Yeh et al. | |
| 2012/0133438 A1 | 5/2012 | Tsuchi et al. | |
| 2012/0249217 A1 | 10/2012 | Fukuda et al. | |
| 2013/0106513 A1 | 5/2013 | Cyrusian et al. | |
| 2013/0114663 A1 | 5/2013 | Ding et al. | |
| 2013/0147553 A1 | 6/2013 | Iwamoto | |
| 2013/0195155 A1 | 8/2013 | Pan et al. | |
| 2013/0215954 A1 | 8/2013 | Beukema et al. | |
| 2013/0259113 A1 | 10/2013 | Kumar | |
| 2013/0334985 A1 | 12/2013 | Kim et al. | |
| 2014/0119479 A1 | 5/2014 | Tajalli | |
| 2014/0176354 A1 | 6/2014 | Yang | |
| 2014/0177696 A1 | 6/2014 | Hwang | |
| 2014/0203794 A1 | 7/2014 | Pietri et al. | |
| 2014/0266440 A1 | 9/2014 | Itagaki et al. | |
| 2014/0312876 A1 | 10/2014 | Hanson et al. | |
| 2015/0070201 A1 | 3/2015 | Dedic et al. | |
| 2015/0146771 A1 | 5/2015 | Walter | |
| 2015/0198647 A1 | 7/2015 | Atwood et al. | |
| 2016/0013954 A1 | 1/2016 | Shokrollahi et al. | |
| 2016/0197747 A1 | 7/2016 | Ulrich et al. | |

(56) References Cited

U.S. PATENT DOCUMENTS

| | | |
|---|---|---|
| 2017/0085239 A1 | 3/2017 | Yuan et al. |
| 2017/0104458 A1 | 4/2017 | Cohen et al. |
| 2017/0214374 A1 | 7/2017 | Tajalli |
| 2017/0302237 A1 | 10/2017 | Akter et al. |
| 2017/0309346 A1 | 10/2017 | Tajalli et al. |
| 2019/0199557 A1 | 6/2019 | Taylor et al. |
| 2019/0221153 A1 | 7/2019 | Tsuchi et al. |
| 2020/0321778 A1 | 10/2020 | Gharibdoust et al. |

OTHER PUBLICATIONS

Shekhar, S., et al., "Design Considerations for Low-Power Receiver Front-End in High-Speed Data Links", Proceedings of the IEEE 2013 Custom Integrated Circuits Conference, Sep. 22, 2013, 1-8 (8 pages).

Anadigm, "Using the Anadigm Multiplier CAM", Design Brief 208, www.anadigm.com, Copyright 2002, 2002, (6 pages).

Kim, Kyu-Young, et al., "8 mW 1.65-Gbps continuous-time equalizer with clock attenuation detection for digital display interface", Analog Integrated Circuits and Signal Processing, Kluwer Academic Publishers, vol. 63, No. 2, Oct. 11, 2009, 329-337 (9 pages).

Palmisano, G., et al., "A Replica Biasing for Constant-Gain CMOS Open-Loop Amplifiers", Circuits and Systems, IEEE International Symposium in Monterey, CA, May 31, 1998, 363-366 (4 pages).

Schneider, J., et al., "ELEC301 Project: Building an Analog Computer", http://www.clear.rice.edu/elec301/Projects99/anlgcomp/, Dec. 19, 1999, (9 pages).

Takahashi, Masayoshi, et al., "A 2-GHz Gain Equalizer for Analog Signal Transmission Using Feedforward Compensation by a Low-Pass Filter", IEICE Transactions on Fundamentals of Electronics, vol. E94A, No. 2, Feb. 2011, 611-616 (6 pages).

Tierney, J., "A Digital Frequency Synthesizer", Audio and Electroacoustics, IEEE Transactions, pp. 48-57, vol. 19, No. 1, Abstract, Mar. 1971, (1 page).

Wang, Hui, et al., "Equalization Techniques for High-Speed Serial Interconnect Transceivers", Solid-State and Integrated-Circuit Technology, 9th International Conference on ICSICT, Piscataway, NJ, Oct. 20, 2008, 1-4 (4 pages).

Dickson, Timothy, et al., "A 1.8 pJ/bit 16x16 Gb/s Source-Sychronous Parallel Interface in 32 nm SOR CMOS with Receiver Redundancy for Link Recalibration", IEEE Journal of Solid-State Circuits, vol. 51, No. 8, Jul. 8, 2016, 1744-1755 (12 pages).

\* cited by examiner

DYNAMIC INTEGRATION TIME ADJUSTMENT OF A CLOCKED DATA SAMPLER USING A STATIC ANALOG CALIBRATION CIRCUIT

CROSS-REFERENCE TO RELATED APPLICATIONS

This application is a continuation of U.S. application Ser. No. 16/378,467, filed Apr. 8, 2019, entitled "Dynamic Integration Time Adjustment of a Clocked Data Sampler Using a Static Analog Calibration Circuit", which is hereby incorporated by reference in its entirety for all purposes.

REFERENCES

The following prior applications are herein incorporated by reference in their entirety for all purposes:

U.S. Patent Publication US-2017-0309346-A1 of application Ser. No. 15/494,435, filed Apr. 21, 2017, naming Armin Tajalli, entitled "Calibration Apparatus and Method for Sampler with Adjustable High Frequency Gain", hereinafter identified as [Tajalli I].

U.S. Pat. No. 10,200,218 of application Ser. No. 15/792,696 filed Oct. 24, 2017, naming Armin Tajalli, entitled "Cascaded Sampler with Increased Wideband Gain", hereinafter identified as [Tajalli II].

FIELD OF THE INVENTION

The present invention relates to communications systems circuits generally, and more particularly to the adjustment and control of circuits that instantaneously obtain an amplitude measurement of an input signal, relative to a provided reference signal level and clock.

BACKGROUND

In modern digital systems, digital information has to be processed in a reliable and efficient way. In this context, digital information is to be understood as information available in discrete, i.e., discontinuous values. Bits, collection of bits, but also numbers from a finite set can be used to represent digital information.

In most chip-to-chip, or device-to-device communication systems, communication takes place over a plurality of wires to increase the aggregate bandwidth. A single or pair of these wires may be referred to as a channel or link and multiple channels create a communication bus between the electronic components. At the physical circuitry level, in chip-to-chip communication systems, buses are typically made of electrical conductors in the package between chips and motherboards, on printed circuit boards ("PCBs") boards or in cables and connectors between PCBs. In high frequency applications, microstrip or stripline PCB traces may be used.

Common methods for transmitting signals over bus wires include single-ended and differential signaling methods. In applications requiring high speed communications, those methods can be further optimized in terms of power consumption and pin-efficiency, especially in high-speed communications. More recently, vector signaling methods have been proposed to further optimize the trade-offs between power consumption, pin efficiency and noise robustness of chip-to-chip communication systems. In those vector signaling systems, digital information at the transmitter is transformed into a different representation space in the form of a vector codeword that is chosen in order to optimize the power consumption, pin-efficiency and speed trade-offs based on the transmission channel properties and communication system design constraints. Herein, this process is referred to as "encoding". The encoded codeword is communicated as a group of signals from the transmitter to one or more receivers. At a receiver, the received signals corresponding to the codeword are transformed back into the original digital information representation space. Herein, this process is referred to as "decoding".

Regardless of the encoding method used, the received signals presented to the receiving device must be sampled (or their signal value otherwise recorded) at intervals best representing the original transmitted values, regardless of transmission channel delays, interference, and noise. This sampling may occur independently in the time domain (as examples, in the analog domain using a sample-and-hold circuit, or in the digital domain using a clocked latch,) and in the amplitude domain, (as examples, using a comparator or slicer,) or as a combined time and amplitude sampling operation, using a clocked comparator or sampler. The timing of this sampling or slicing operation is controlled by an associated Clock and Data Alignment (CDA) timing system, which determines the appropriate sample timing.

BRIEF DESCRIPTION

Methods and systems are described for generating a process-voltage-temperature (PVT)-dependent reference voltage at a reference branch circuit based on a reference current obtained via a band gap generator and a common mode voltage input, generating a PVT-dependent output voltage at an output of a static analog calibration circuit responsive to the common mode voltage input and an adjustable current, adjusting the adjustable current through the static analog calibration circuit according to a control signal generated responsive to comparisons of the PVT-dependent output voltage to the PVT-dependent reference voltage, and configuring a clocked data sampler with a PVT-calibrated current by providing the control signal to the clocked data sampler.

Circuits performing timed signal amplitude measurements, commonly referred to as "samplers", are known in the art. Combining the time-sampling behavior of analog sample-and-hold or digital latches with the amplitude comparison behavior of a digital comparator or slicer, they are a common element of Data Communications receivers, typically providing the interface between front-end analog signal processing, and back-end digital data handling.

Sampler circuits have been derived from analog signal comparators, clocked digital latches, and other mixed analog/digital circuit architectures, each such architectural variation having known benefits and limitations. One architecture in particular, the clocked dynamic integrator/sampler, has been recognized for its ability to enable high speed operation, while still drawing low supply current. Derived from the classic analog differential comparator as shown in [Tajalli I], the sampler operates dynamically, charging an internal circuit node under control of a clock signal, then discharging that node through the comparison circuit, providing a timed comparison of active and reference input signals at the moment of clock signal transition. One embodiment of a clocked dynamic sampler is described in [Tajalli II].

Although fast and drawing low power, the dynamic nature of these circuits may lead to drift and stability issues in a production environment. Although individual MOS transistors within a given integrated circuit may be matched closely, their absolute operational parameters, in particular gate threshold voltage, gain, and channel resistance, may vary considerably between die, as well as within a die over variations in temperature and supply voltage. These variations may result in differences in data detection accuracy between devices, and may also lead to degradation of data detection within a device over variations in operating conditions.

Embodiments are described to measure operational characteristics of samplers as part of a closed-loop control system to mitigate the effect of such variations. To minimize impact on the production data detection path, an independent static analog circuit is used as a measurement proxy for the dynamic production circuit's operational characteristics.

DETAILED DESCRIPTION

Figure 1:
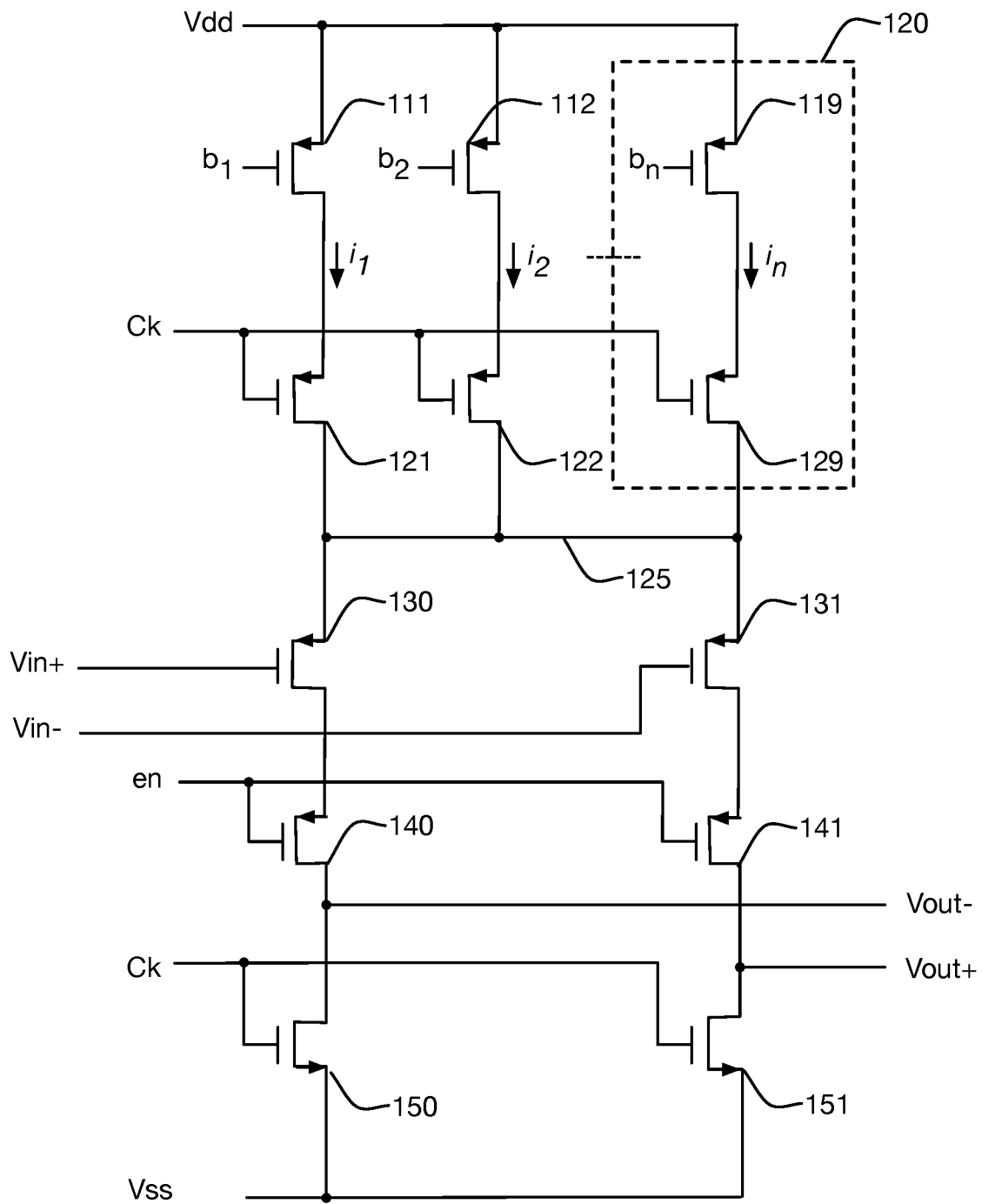
FIG. 1 shows one embodiment of a clocked dynamic integrator/sampler circuit.

To reliably detect the data values transmitted over a communications system, a communications receiver must accurately measure its received signal value amplitudes at carefully selected times, typically at or near the center of that received signal's period of stability between transitions (i.e. once per receive unit interval, or UI.) The source of the received signal may be derived from a single wire signal, or may be derived from a weighted linear combination of multiple wire signals, such as provided by a Multi Input Comparator or mixer (MIC) used to detect vector signaling codes.

In some embodiments, the value of the received signal is first captured at the selected time using a sample-and-hold or track-and-hold circuit, and then the resulting value is measured against one or more reference values using a known voltage comparator circuit. Alternatively, the analog level of the received signal may be measured against a reference voltage using a comparator or "slicer", with the digital result captured by a clocked digital latch.

The optimum point at which the received signal is measured is commonly described as the "center of eye", (referring to the well-known "eye diagram" of signal amplitude vs. clock intervals.) In the time dimension, the sampling point is typically determined by use of a local "receive clock" which is configured to occur at that desirable sampling time. Generation and ongoing control of such receive clock timing is well understood in the art, as Clock Data Alignment (CDA, also known as Clock Data Recovery or CDR) systems measure and incrementally adjust sample timing versus receive signal stability time to optimize sample timing.

Similarly, the optimum reference level for the received signal's amplitude comparison may be dynamically generated. Decision Feedback Equalization or DFE is one such technique used to improve signal detection capabilities in serial communication systems. It presumes that the transmission line characteristics of the communications channel between transmitter and receiver are imperfect, thus energy associated with previously transmitted bits may remain in the channel (for example, as reflections from impedance perturbations) to negatively impact reception of subsequent bits. A receiver's DFE system processes each bit detected in a past unit interval (UI) through a simulation of the communications channel to produce an estimate of that bit's influence on a subsequent unit interval. That estimate, herein called the "DFE correction", may be subtracted from the received signal to compensate for the predicted inter-symbol interference. Alternative embodiments may perform the functionally equivalent operation of such subtraction, by measuring the received signal (e.g. using a differential comparator) at a reference voltage level derived from the DFE correction signal. Practical DFE systems apply DFE corrections derived from multiple previous unit intervals (herein individually described as "DFE factors") to the received signal before detecting a data bit.

Circuits performing a combined amplitude/time measurement, commonly referred to as "samplers", are also known in the art. Combining the time-sampling behavior of analog sample-and-hold or digital latches with the amplitude comparison behavior of a digital comparator or slicer, they are a common element of Data Communications receivers, typically providing the interface between front-end analog signal processing, and back-end digital data handling. Sampler circuits have been derived from analog signal comparators, clocked digital latches, and other mixed analog/digital circuit architectures, each such architectural variation having known benefits and limitations.

One sampler architecture in particular, the clocked dynamic integrator/sampler, has been recognized for its ability to enable high speed operation, while still drawing low supply current. Derived from the classic analog differential comparator as shown in [Tajalli I], the sampler operates dynamically, charging an internal circuit node under control of a clock signal, then discharging that node through the comparison circuit, providing a timed comparison of active and reference input signals at the moment of clock signal transition. One embodiment of a clocked dynamic sampler is described in [Tajalli II].

Although fast and drawing low power, the dynamic nature of these circuits may lead to drift and stability issues in a production environment. Although individual MOS transistors within a given integrated circuit may be matched closely, their absolute operational parameters, in particular gate threshold voltage, gain, and channel resistance, may vary considerably between die, as well as within a die over variations in temperature and supply voltage. These variations may result in differences in data detection accuracy between devices, and may also lead to degradation of data detection within a device over variations in operating conditions.

Embodiments are described to measure operational characteristics of samplers as part of a closed-loop control system to mitigate the effect of such variations. To minimize impact on the production data detection path, an independent static analog calibration circuit is used as a measurement proxy for the dynamic production circuit's operational characteristics.

FIG. 1 shows one embodiment of a clocked dynamic integrator/sampler circuit, which in one particular embodiment is a component of a DFE computation subsystem. Dynamic circuits typically operate in multiple phases of activity, as controlled by an input clock signal. For the circuit of FIG. 1, transistors 111, 112, . . . 119 provide a charging path when input clock Clk is low, allowing current to flow from Vdd to charge the distributed capacitance of internal circuit node 125. The rate of charging may be configured by enabling more than one of the charging transistors using control signals [$b_1$, $b_2$, . . . $b_n$]. As indicated by the ellipsis, additional instances as 220 may be included in parallel with charging path transistors 111, 112, etc. to support additional bits of control. For a given duration of clock-low charging interval and node capacitance, the terminal voltage of node 225 will increase for larger (i.e. more transistors enabled) values of control signal [$b_1$, $b_2$, . . . $b_n$]. When the charging paths are enabled, current flows through differential input transistors 130 and 131, in amounts proportional to differences in input signals Vin+ and Vin−. Thus, the output voltages at Vout− and Vout+ will be initially low (discharged), and increasing towards Vdd starting at the falling edge of Clk at rates determined by the input signals Vin+ and Vin− on transistors 130 and 131, respectively. The duration of this charging, also known as the integration time of the integrator/sampler, thus begins at the falling clock edge and ends when the output voltage of one of the output nodes becomes high enough that either transistor 140 or 141 no longer has sufficient gate-to-drain voltage to remain on.

When input clock Clk goes high, the charging path is interrupted, and discharge paths via two branches are enabled to reset the pair of output nodes prior to the subsequent sampling interval. As shown in FIG. 1, the discharge paths may include transistors 130, 140, 150, and transistors 131, 141, 151. Control signal en additionally enables or disables these discharge paths; for purposes of this description it may be assumed that en is configured such that transistors 140 and 141 are on, and the discharge paths thus can be enabled by the clock signal Clk.

In some embodiments, the structure of the clocked data sampler may be reversed, in which the pair of output nodes are pre-charged according to the sampling clock, and subsequently discharged at varying rates according to the input signal Vin+ and Vin−. Latches connected to the differential output nodes Vout+ and Vout− may be used to convert the integrated signal into a latched digital output for either implementation.

The resulting differential result Vout is dependent not only on the input signals, but to some degree also on the gain of input transistors 130/131 and the channel characteristics of transistors 140, 141, 150, 151, which are known to vary with the integrated circuit process, current, and over time and temperature. Thus, an associated control generator will typically adjust control signals [$b_1$, $b_2$, . . . $b_n$], modifying the magnitude of the current when charging the pair of output nodes Vout+ and Vout− so as to obtain a consistent differential result.

In some scenarios, a sampler calibration may be performed by adjusting a current based a common-mode value, and then measuring the sampler performance to ensure the current provides a proper sampling interval. Such scenarios would provide a duplicate dynamic sampler as in FIG. 1, but it would need to be clocked at the same rate as the primary sampler and such circuit duplication would not eliminate the need for fast output measurement.

Alternatively, as described herein, a static analog calibration circuit is utilized as a measurement proxy for a dynamic circuit such as that of FIG. 1. It is noted that the inherent transistor characteristics producing the process- and environmental-variations in behavior of FIG. 1 are transistor gain, transistor threshold voltage, and transistor channel characteristics such as "on" resistance, and all of those elements are conducive to static or steady-state measurement.

Figure 2:
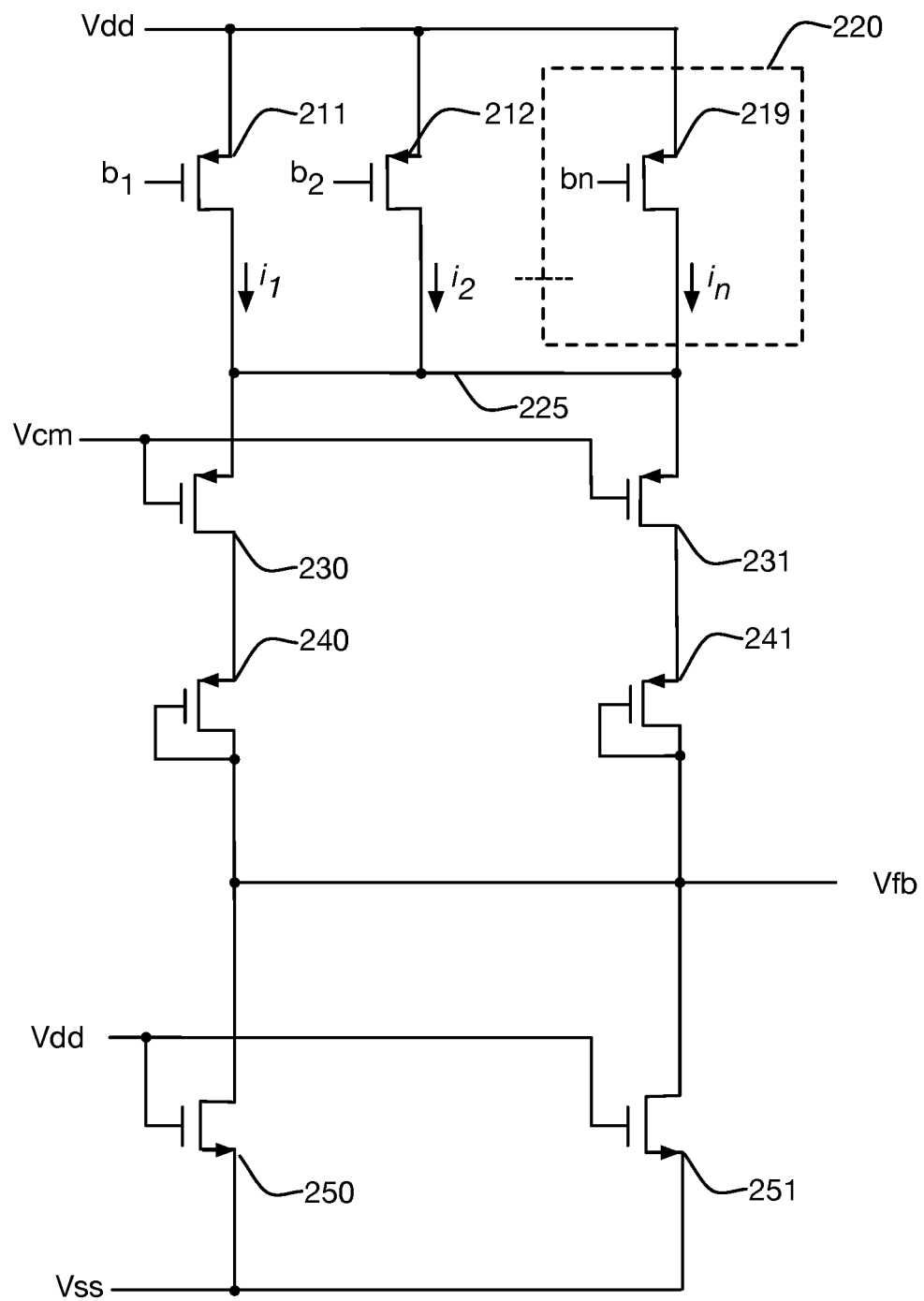
FIG. 2 shows one embodiment of a static analog calibration circuit, which may be used as a measurement proxy for a dynamic circuit such as that of FIG. 1.

FIG. 2 shows one embodiment of a static analog calibration circuit duplicating the structure of FIG. 1 dynamic circuit but omitting the clocked operation. Each transistor in the circuit of FIG. 2 is of identical size and design characteristics as its equivalent device in FIG. 1. Thus, as examples, static currents $i_1$, $i_2$, . . . $i_n$ of FIG. 2 will be essentially identical to the initial (i.e. peak) charging currents $i_1$, $i_2$, . . . $i_n$ of FIG. 1 for the same values of control signals [$b_1$, $b_2$, . . . $b_n$]. The total current is herein called $\Sigma_1^n$ $i_n = i_{tot}$ for descriptive convenience. In the static embodiment of FIG. 2, both signal inputs are tied to Vcm, corresponding to the common mode voltage input of active inputs Vin+ and Vin−. For systems in which the input signals are capacitively coupled, this would be equivalent to the post-capacitor bias voltage. The static analog calibration circuit generates a process-voltage-temperature (PVT)-dependent output voltage Vfb based on the common mode voltage input and the adjustable current provided via transistors 211, 212, . . . , 219.

Figure 3:
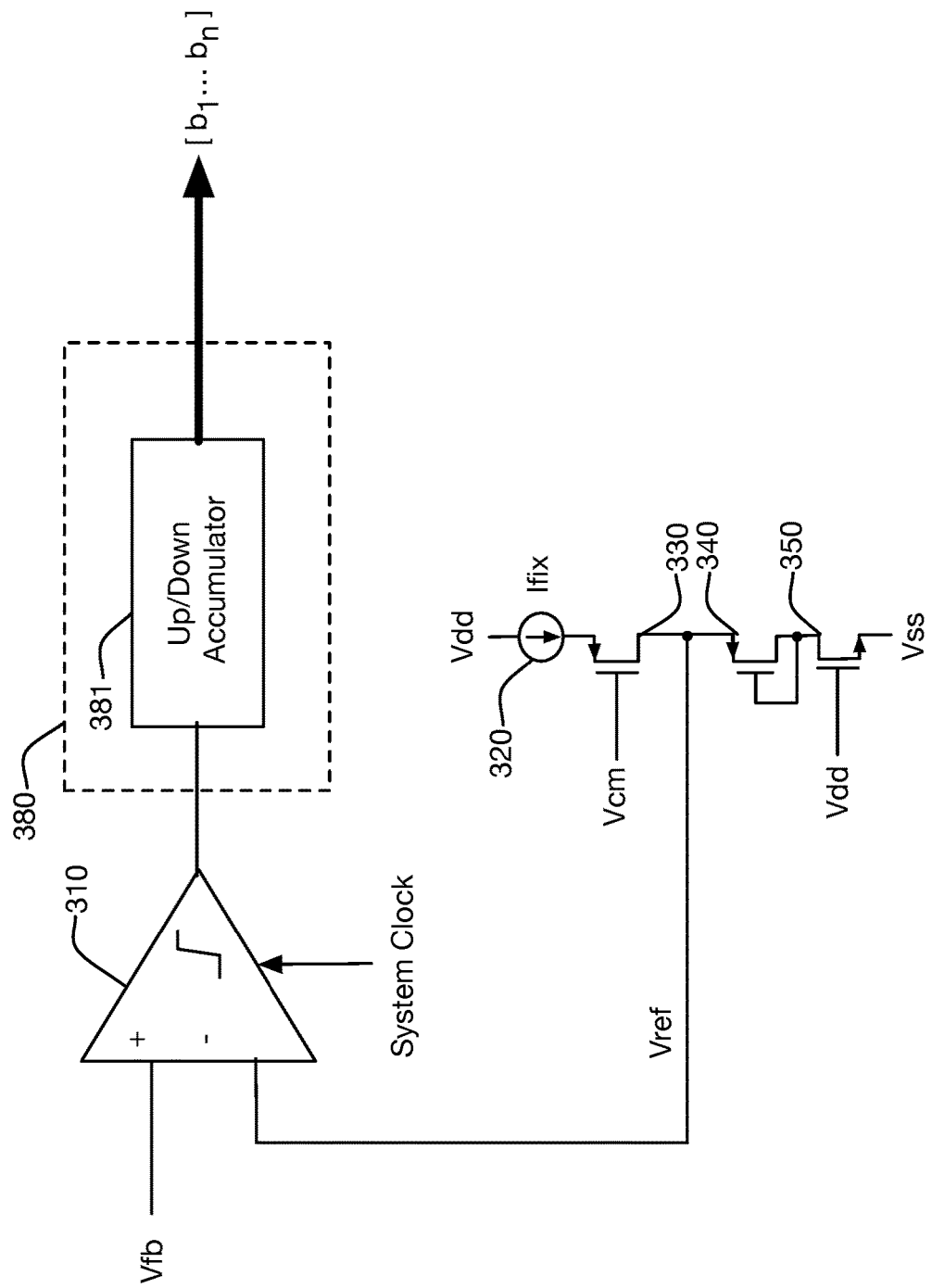
FIG. 3 illustrates one embodiment of a reference branch circuit providing a known reference signal to be compared with a measured value as a decision input to a control signal generator.

FIG. 3 illustrates one embodiment of a reference branch circuit providing a known reference signal to be compared with a measured value as a decision input to a control signal generator. The reference branch includes a current source 320 and transistors 330, 340, 350 that are topologically identical to one branch of the previous circuits, e.g., 130, 140, 150, respectively, with transistors of comparable size and design characteristics. However, the current provided by reference current source 320 is derived from a standard band-gap reference, and will be consistent across process variations as well as device voltage and temperature. Thus, Vref will represent a PVT-dependent reference voltage generated by applying a known and standardized reference current obtained from a band gap generator to transistors 330, 340, and 350 according to the common mode voltage input Vcm.

Comparator 310 compares the PVT-dependent output voltage Vfb obtained from FIG. 2 to the PVT-dependent reference voltage Vref, producing an error indication to control signal generator 380 which informs corrective changes to control signals [$b_1$, $b_2$, . . . $b_n$] and thus adjusting the adjustable current $I_{tot}$. For descriptive simplicity, 380 is shown as incorporating up/down accumulator 381, which counts up or down based on the result of 310, thus modifying control [$b_1$, $b_2$, . . . $b_n$] and thus the sourced current $i_{tot}$, so as to produce essentially equal results from the static analog calibration circuit of FIG. 2 and the reference branch circuit of FIG. 3. The same control signal value [$b_1$, $b_2$, . . . $b_n$] may then be applied to clocked dynamic integrator/sampler circuits as shown in FIG. 1, using the proxy measurement of the static circuit to provide updated control values for the active dynamic circuit.

Figure 4:
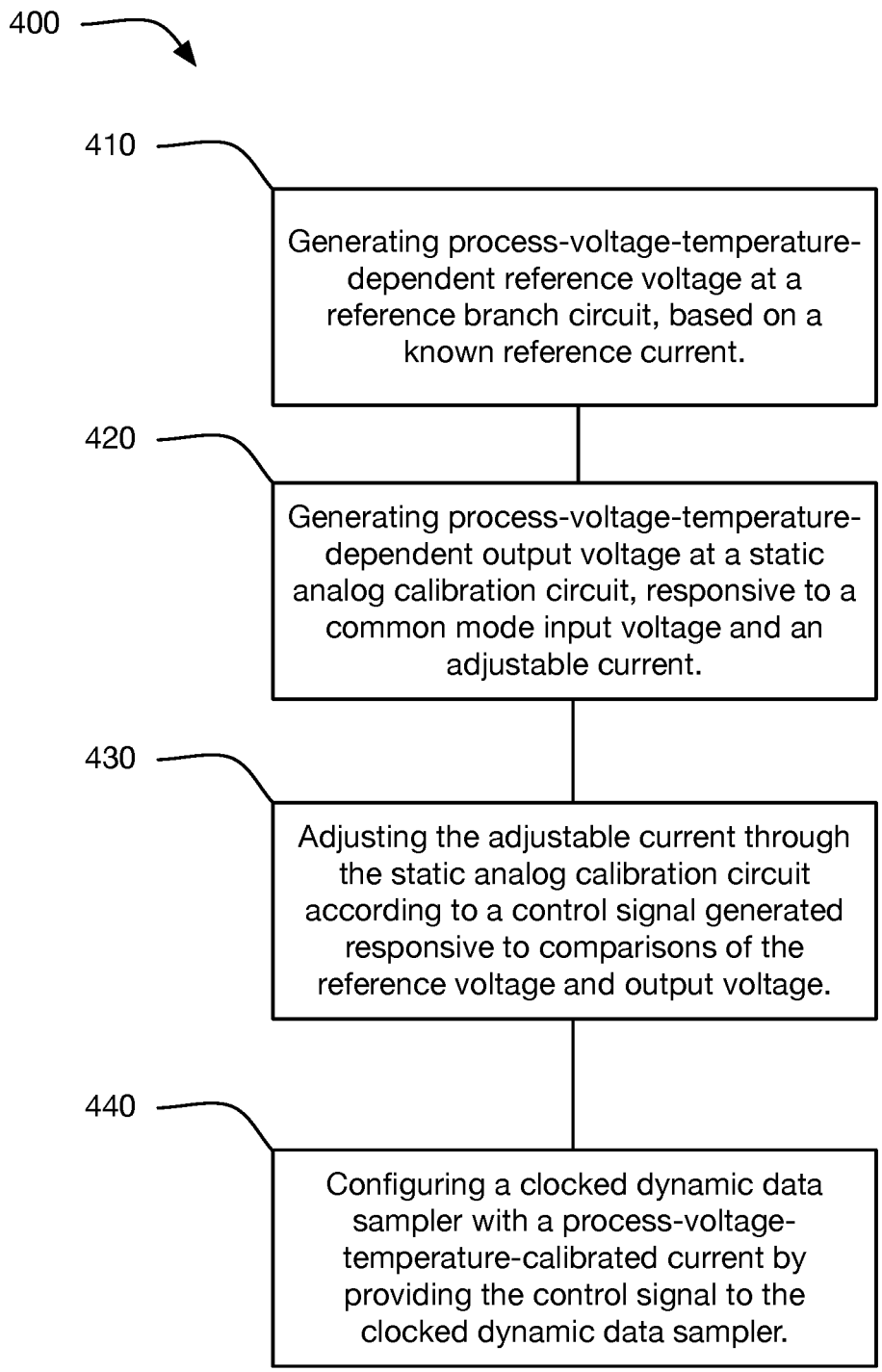
FIG. 4 is a flow chart illustrating one method in accordance with an embodiment.

FIG. 4 is a flow chart of a method 400 in accordance with some embodiments. As shown, method 400 includes generating 410 a process-voltage-temperature (PVT)-dependent reference voltage at a reference branch circuit based on a reference current obtained via a band gap generator and a common mode voltage input, generating 420 a PVT-dependent output voltage at an output of a static analog calibration circuit responsive to the common mode voltage input and an adjustable current, adjusting 430 the adjustable current through the static analog calibration circuit according to a control signal generated responsive to comparisons of the PVT-dependent output voltage to the PVT-dependent reference voltage, and configuring 440 a clocked data sampler with a PVT-calibrated current by providing the control signal to the clocked data sampler.

In some embodiments, the adjustable current is adjusted until the PVT-dependent output voltage is equal to the PVT-dependent reference voltage, or within some predetermined threshold. In some embodiments, the reference branch circuit corresponds to a replica of a branch circuit in the static analog calibration circuit. In some such embodiments, the adjustable current is split between through two branch circuits of the static analog calibration circuit and has a magnitude that is twice the magnitude of the reference current.

In some embodiments, the method further includes enabling the static analog calibration circuit and the reference branch circuit via enabling transistors. In some such embodiments, the static analog calibration circuit and the reference branch circuit are enabled to calibrate the PVT-calibrated current. In some embodiments, the static analog calibration circuit and the reference branch circuit are enabled responsive to a change in temperature. In some embodiments, the static analog calibration circuit and the reference branch circuit are enabled at system startup. In some embodiments, the static analog calibration circuit and the reference branch circuit are enabled responsive to a change in common mode input voltage.

In some embodiments, the control signal includes a plurality of bits. Some embodiments may utilize a binary code control signal for enabling corresponding current sources having different sizes connected in parallel in the clocked data sampler. Alternative embodiments may utilize a thermometer code control signal for enabling corresponding equal-sized current sources connected in parallel in the clocked data sampler.

In some embodiments, the comparisons between the PVT-dependent output voltage and the PVT-dependent reference voltage are accumulated in an accumulator circuit. Such an accumulator circuit may be a digital accumulator configured to accumulate comparisons from the comparator 310 in a least-significant-bit (LSB) portion, while a most-significant-bit portion provides the multi-bit control signal. Alternative accumulation devices may also be used. In some embodiments, the comparisons between the PVT-dependent output voltage and the PVT-dependent reference voltage are generated using a chopper amplifier 310, as depicted in FIG. 3. Such an amplifier may be clocked by a system clock at a suitable rate, such as 50 MHz.

In some embodiments, the method further includes obtaining the common mode voltage input via a resistor-capacitor (RC) network connected to an output of a variable gain amplifier (VGA), the resistor-capacitor network operating on an information signal processed by the clocked data sampler. Such an RC network may correspond to a low-pass filter.

Other embodiments of control signal generator 380 may incorporate finite state machines, software or firmware executing on an embedded processor, or dedicated hardware to perform the described generation, measurement, adjustment, and configuration operations. In some embodiments, control signal operations occur periodically. In some embodiments, some or all of the static analog calibration circuit and the reference branch circuit may be powered down or disabled between measurements to reduce overall power consumption. Some embodiments operate at initial system startup to measure and compensate for process-related circuit differences. Further embodiments operate during some portion of normal system operation to measure and compensate for PVT-related variations. Control signals and/or their corresponding adjustments may represent equal-sized changes encoded in a thermometer code, binary weighted adjustments represented in a binary or gray code, and/or other functional encodings.

The invention claimed is:

1. An apparatus comprising:
a clocked data sampler operating in a data signal processing path, the clocked data sampler configured to integrate a differential input data signal according to an adjustable integration current;
a static analog calibration circuit configured to generate a PVT-dependent output voltage responsive to a common mode voltage input associated with the differential input data signal and an adjustable current; and
a control signal generator configured to obtain a reference voltage, and to accumulate comparisons between the PVT-dependent output voltage and the reference voltage to generate a control signal for adjusting the adjustable current through the static analog calibration circuit, the control signal further configuring the adjustable integration current of the clocked data sampler with a PVT-calibrated current.

2. The apparatus of claim 1, further comprising a reference branch circuit configured to generate the reference voltage based on a reference current obtained via a band gap generator and the common mode voltage input.

3. The apparatus of claim 2, wherein the reference branch circuit corresponds to a replica of one half of the static analog calibration circuit.

4. The apparatus of claim 1, wherein the control signal generator is configured to adjust the adjustable current until the PVT-dependent output voltage is equal to the reference voltage.

5. The apparatus of claim 1, wherein the static analog calibration circuit comprises enabling transistors, and wherein the enabling transistors are selectively enabled to calibrate the PVT-calibrated current.

6. The apparatus of claim 5, wherein the enabling transistors are selectively enabled responsive to a change in temperature.

7. The apparatus of claim 5, wherein the enabling transistors are selectively enabled responsive to a change in common mode input voltage.

8. The apparatus of claim 1, wherein the control circuit comprises a digital accumulator configured to accumulate the comparisons between the PVT-dependent output voltage and the reference voltage.

9. The apparatus of claim 1, wherein the control signal generator comprises a chopper amplifier configured to generate the comparisons between the PVT-dependent output voltage and the reference voltage.

10. The apparatus of claim 1, wherein the common mode voltage input is obtained via a resistor-capacitor network connected to a variable gain amplifier (VGA) operating on the differential input data signal.

11. A method comprising:
integrating a differential input data signal according to an adjustable integration current using a clocked data sampler operating in a data signal processing path;
generating, using a static analog calibration circuit, a PVT-dependent output voltage responsive to a common mode voltage input associated with the differential input data signal and an adjustable current;
obtaining the PVT-dependent output voltage and a reference voltage at a control signal generator, and accumulating comparisons between the PVT-dependent output voltage and the reference voltage to generate a control signal for adjusting the adjustable current through the static analog calibration circuit, the control signal further configuring the adjustable integration current of the clocked data sampler with a PVT-calibrated current.

12. The method of claim 11, further comprising generating the reference voltage using a reference branch circuit based on a reference current obtained via a band gap generator and the common mode voltage input.

13. The method of claim 12, wherein the reference branch circuit corresponds to a replica of one half of the static analog calibration circuit.

14. The method of claim 11, the adjustable current is adjusted until the PVT-dependent output voltage is equal to the reference voltage.

15. The method of claim 11, further comprising selectively enabling the static analog calibration circuit via enabling transistors to calibrate the PVT-calibrated current.

16. The method of claim 15, wherein the enabling transistors are selectively enabled responsive to a change in temperature.

17. The method of claim 15, wherein the enabling transistors are selectively enabled responsive to a change in common mode input voltage.

18. The method of claim 11, wherein the comparisons between the PVT-dependent output voltage and the reference voltage are accumulated in a digital accumulator.

19. The method of claim 11, the comparisons between the PVT-dependent output voltage and the reference voltage are generated using a chopper amplifier.

20. The method of claim 11, further comprising obtaining the common mode voltage input from a resistor-capacitor network connected to a variable gain amplifier (VGA) operating on the differential input data signal.

* * * * *